(12) United States Patent
Kimura et al.

(10) Patent No.: US 6,573,578 B2
(45) Date of Patent: Jun. 3, 2003

(54) PHOTO SEMICONDUCTOR INTEGRATED CIRCUIT DEVICE AND OPTICAL RECORDING REPRODUCING APPARATUS

(75) Inventors: Shigeharu Kimura, Tokyo (JP); Kenji Maio, Tokyo (JP); Takeshi Doi, Kokubunji (JP); Yoichi Tamaki, Kokubunji (JP); Takeshi Shimano, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/922,157

(22) Filed: Aug. 6, 2001

(65) Prior Publication Data

US 2002/0070417 A1 Jun. 13, 2002

(30) Foreign Application Priority Data

Dec. 7, 2000 (JP) ......................... 2000-373113

(51) Int. Cl.$^7$ ..................... H01L 27/14; H01L 31/00; H01L 31/06
(52) U.S. Cl. .................. 257/431; 257/444; 257/462; 257/463
(58) Field of Search ............... 257/431, 444, 257/462, 463

(56) References Cited

U.S. PATENT DOCUMENTS 3,925,801 A * 12/1975 Haitz et al. ............. 250/214 C
5,858,812 A * 1/1999 Furumiya ................... 438/146

FOREIGN PATENT DOCUMENTS

| JP | 4-82268 | 3/1992 | ............ H01L/27/14 |
| JP | 11-266033 | 9/1999 | ............ H01L/31/10 |

OTHER PUBLICATIONS

English Language Abstract 04–82268 Mar. 16, 1992.

* cited by examiner

Primary Examiner—Amir Zarabian
Assistant Examiner—Kiesha Rose
(74) Attorney, Agent, or Firm—Antonelli, Terry, Stout, & Kraus, LLP

(57) ABSTRACT

A photo semiconductor integrated circuit device has a photodiode portion and amplifier portion, each portion having a buried layer. The impurity concentration and/or depth of the buried layer for the photodiode portion is lower than that of the buried layer for the amplifier portion. As a result, the frequency band width is widened.

1 Claim, 9 Drawing Sheets

OXIDE THICKNESS (μm)

OXIDE THICKNESS (μm)

PHOTO SEMICONDUCTOR INTEGRATED CIRCUIT DEVICE AND OPTICAL RECORDING REPRODUCING APPARATUS

BACKGROUND OF THE INVENTION

1. Field of the Invention

This invention concerns a photo semiconductor integrated circuit device having a photodiode portion and an amplifier portion.

2. Description of the Related Art

A photo semiconductor integrated circuit device having a photodiode portion and an amplifier portion is used for light detection and signal processing, for example, in CD (Compact Disk) drives or DVD (Digital Versatile Disk) drives as optical information recording reproducing apparatus. A semiconductor integrated circuit device and a photodetector have been generally manufactured separately so far and detection signals from a photodiode are sent by way of wirings such as lead wires to the semiconductor integrated circuit device and applied with processing such as amplification. However, in the CD drives, it has been demanded for high-speed operation of reading and size reduction of apparatus, and those referred to as OEIC (Optoelectronic Integrated Circuit Device) in which a photodiode and a semiconductor integrated circuit are prepared on one identical substrate have been manufactured in order to cope therewith. The structure is described for example in JP-A-266033/1999. Further, JP-A-82268/1992 describes a semiconductor device having a semiconductor substrate of a first conduction type and a photodiode constituted with an epitaxial layer of a second conduction type in which a semiconductor region at a concentration lower than an epitaxial layer or the semiconductor surface is formed below the epitaxial layer, or a semiconductor region of a first conduction type at a concentration higher than the semiconductor substrate is formed below the epitaxial layer thereby improving the responsivity and extending the band width of the photodiode.

FIG. 2 is a schematic cross sectional view for one example of a photo semiconductor integrated circuit device with a photodiode prepared on an SOI (Silicon on Insulator) substrate. In FIG. 2, are shown a photodiode portion 1 and a transistor portion 2 as a part of an amplifier portion. The devices are prepared on the SOI substrate in which an n-type silicon handle wafer 30, an oxide layer 40 and a silicon crystal layer (that is, an SOI layer 31) are formed.

In the transistor portion 2, a collector 63, an emitter 64 and a base 65 are formed on a passivation layer 43. An n⁻ type epitaxial layer 32 is present on the SOI layer 32, and constitutes together with a base diffusion layer 33 and an emitter diffusion layer 35. A polysilicon layer 34 is provided for leading out the base layer 33, and an oxide layer 45 is provided on layer 34. A buried layer 50 as a high concentration impurity layer prepared on the surface of the substrate before growing a silicon layer by epitaxial growing, is formed by introducing an impurity into the SOI layer 31 for lowering the collector resistance and is connected by way of an n-type diffusion layer 51 for collector junction to an upper electrode (collector). It is conducted with the emitter 64 by way of the emitter diffusion layer 35, polysilicon 36 for emitter and a silicide layer 66. A side wall oxide layer 42 insulates polysilicon for the emitter and the base. Devices are separated from each other by an inter-device isolating buried oxide layer 41 and intra-device isolation is attained by buried oxide layer 46 as a shallow groove.

In the photodiode portion 1, are shown a cathode electrode 61 and an anode electrode 62 of the photodiode. Light 10 to be detected transmitting the oxide layer 44 generates carriers in a p⁺ layer 37, an epitaxial layer 32, and a buried layer 50 to form an photo current between the electrodes 61 and 62. A polysilicon layer 34 is provided for leading out the p⁺ layer 37. The photodiode has a buried layer 50 as in the case of the transistor and is connected to the cathode electrode (upper electrode) 61 by way of an n-type diffusion layer 52 and a suicide layer 67 for cathode connection. Although not illustrated in this example, current from the photodiode is put to signal processing by a group of transistor integrated circuits.

In the photodiode portion 1, are shown a cathode electrode 61 and an anode electrode 62 of the photodiode. Light 10 to be detected transmitting the oxide layer 44 generates carriers in a p⁺ layer 37, an epitaxial layer 32, and a buried layer 50 to form an photo current between the electrodes 61 and 62. The photodiode has a buried layer 50 as in the case of the transistor and is connected to the cathode electrode (upper electrode) 61 by way of an n-type diffusion layer 52 and a silicide layer 67 for cathode connection. Although not illustrated in this example, current from the photodiode is put to signal processing by a group of transistor integrated circuits.

FIG. 3 shows the change of intensity of light in the inside of silicon when silicon crystals are irradiated. The intensity of light is normalized by the intensity at the surface. While the intensity of light decays as the depth increases from the surface and the state of decay is different depending on the wavelength of light. Near the wavelength at 780 nm used in CD drives, light intrudes deeply as far as the inside of the silicon crystals but light at a shorter wavelength of 410 nm is substantially decayed near the surface. Further, the intrusion state of light at a wavelength of 660 nm used in DVD drives situates between both of them.

The light intruding to the inside of silicon generates carriers to form photocurrent. The relation between the state of generation of carriers and the structure of the photodiode constitutes a factor determining the responsivity of the photodiode and the frequency response. FIG. 3 shows an example of a size for the cross sectional structure of a photodiode. PD layer shows a range from p⁺ layer at the surface of the photodiode to a depletion layer end including an n⁻ layer. SOI layer is a silicon crystal layer in which a buried layer is formed. A reverse bias is applied at a sufficient level to the SOI layer relative to the PD layer and the depletion layer reaches as far as the SOI layer. At the wavelength of 410 nm shown by the solid line, since almost of light is absorbed in the PD layer, the cutoff frequency is determined by the drifting speed of the carriers and it is expected to be a cutoff frequency at about Giga Hz. On the other hand, at a wavelength of 780 nm shown by the short dotted line, the light reaches at a sufficient intensity as far as the SOI layer and further reaches as far as the handle wafer. Since a voltage is not applied in the SOI layer as in the depletion layer, the photo generated carriers form a photocurrent through the diffusion process. Since the diffusion process is an extremely slow process, the frequency band width of the photodiode is remarkably narrowed as the ratio of this current increases.

Further, the photodiode responsivity can be improved when more photo generated carriers enter the depletion layer. In the photodiode using the SOI substrate, since it is separated by an insulator from the handle wafer, photo-carriers generated in the handle wafer do not contribute to the photo-current of the photodiode. Accordingly, in a case where a great amount of light intrudes through the oxide layer into the handle wafer as in the case of the light at 780 nm shown in FIG. 3, photodiode of higher responsivity is no more obtainable.

At present, high-speed readout has been demanded in compact disk drives or digital versatile disk drives and higher responsivity and broader band width are required for the photodiode. However, while the production process is optimized to the integrated circuit device portion, when the cutoff frequency or the responsivity of the photodiode is intended to be improved by changing the thickness of the SOI layer and the thickness of the PD layer, the performance of the integrated circuit device portion such as for transistors may possibly be deteriorated.

In view of the foregoing problems, this invention intends to provide a photo semiconductor integrated circuit in which the frequency characteristic or the responsivity of a photodiode prepared on a substrate identical with that for an integrated circuit device is improved without greatly changing the production process for the integrated circuit device, that is, without deteriorating the performance of the integrate circuit device.

SUMMARY OF THE INVENTION

In accordance with this invention, the frequency band width of a photodiode is improved by using an impurity distribution or concentration different from that of the buried layer in an amplifier portion is used in a buried layer in a photodiode portion. Further, the responsivity is improved by optimizing the thickness of an insulator of a substrate.

FIG. 4 shows a schematic view for the cross section of a photodiode. An SOI substrate 300 is used and reference numeral 40 denotes an insulator comprising an oxide layer. Reference numeral 32 denotes an epitaxial layer and a $p^+$ layer 37 is formed at the uppermost portion. FIG. 4(A) illustrates a photodiode portion of an existent structure having a buried layer 50 identical with that for an amplifier portion. In the photodiode portion of the structure shown in FIG. 4(B) according to this invention, the impurity concentration in a buried layer 501 is changed by providing a mask different from that for burying in the integrated circuit device portion and changing ion implanting conditions.

It is assumed that the epitaxial layer is completely depleted and carriers by incident light 10 are generated in the epitaxial layer 32 and the SOI layer changed to the buried layer. Since a reverse bias at a sufficient level is applied between the $p^+$ layer buried layer 37 and the SOI layer, a drift current flows to the epitaxial layer 32. On the other hand, since no voltage is applied to the SOI layer, the photo-carriers form a diffusion current. While the diffusion current is a factor of worsening the frequency response of the photodiode, when the impurity concentration in the buried layer 501 is changed, the diffusion constant therein can be changed to change the diffusion rate.

FIG. 5 shows the change of the cutoff frequency (defined as a frequency for 3 dB lowering) depending on the change of the impurity concentration in the buried layer. Calculation was conducted under the conditions assuming, in the cross sectional view of FIG. 4(B), the thickness a of the epitaxial layer as 1.2 µm, the thickness b for the SOI layer as 1.5 µm, the wavelength of light as 780 nm and the minority carrier lifetime in the buried layer as $3 \times 10^{-3}$ sec. As shown in FIG. 5, it can be seen that the frequency band width is widened as the carrier concentration is decreased. It is practical to decrease the concentration within about one digit when the impurity concentration in the buried layer of the transistor portion is about at $1 \times 10^{18}$ cm$^{-3}$. Even if it is decreased further, the effect of increasing the resistance in the buried layer lowers the cutoff frequency to provide an adverse effect. Accordingly, the impurity concentration in the buried layer of the photodiode portion is preferably about from $1 \times 10^{17}$ cm$^{-3}$ to $1 \times 10^{18}$ cm$^{-3}$. Further, while the frequency band width is widened as the thickness of the epitaxial layer forming the depletion layer is increased, the thickness of the epitaxial layer is preferably 0.8 µm or more while taking the thickness of the SOI layer into consideration since light intrudes deeply in a case of detecting light at a longer wavelength of 780 nm.

Further, for improving the responsivity of the photodiode, as shown in FIG. 6, it adopts a method of increasing the reflected light by an oxide layer 401 of an SOI substrate thereby generating carriers in the photodiode. When the thickness c for the oxide layer 401 in FIG. 6 is changed, the intensity of the reflected light 11 changes. Since the reflected light 11 generates carriers in the inside of the photodiode again, the responsivity is improved when the reflected light is increased.

The reflectivity R(δ) by the oxide layer 401 in the inside of the silicon is represented by the following equation (1).

$$R(\delta) = 2r^2\{1 - \cos(2\delta)\}/(1 - 2r^2\cos(2\delta) + r^4) \quad (1)$$

where $\delta = 2\pi nc/\lambda$, r represents a reflection coefficient when a light incidents vertically from silicon to an oxide layer, n represents a refractive index of the oxide layer, c represents the thickness of the oxide layer and λ represents the wavelength of the light.

It can be seen from the equation (1) that the reflected light increases on the condition that the thickness c of the oxide layer is about: λ÷(4×n)×(positive odd number) Assuming the wavelength used as 780 nm, the surface reflectivity as 0.26 and the refractive index n for the oxide layer as 1.46, first two cases for the oxide layer thickness c that maximize the reflectance are 130 nm and 401 nm according to the equation described above.

Further, FIG. 7 shows the dependence of the responsivity on the thickness of the oxide layer when the same structure as the photodiode used in FIG. 4 is adapted according to the equation described above. The result of calculation for the responsivity shows the same trend and the responsivity is maximized at the maximum reflectance. While calculation has been conducted only up to the layer thickness including the two initial peaks, it is expected for the larger layer thickness that peaks for the responsivity will appear at about: λ÷(4×n)×(positive odd number). As described above, a photodiode of higher responsivity can be obtained by selecting the thickness of the oxide layer of the SOI substrate such that the reflected light is maximized relative to the wavelength used.

Then, as a method of making the cutoff frequency higher, when the buried layer formed in the SOI layer, as shown in the cross sectional structure of the photodiode in FIG. 8, a buried layer 502 is distributed deeper by d from the surface of the SOI layer compared with the buried layer 50 of the existent structure shown in FIG. 4(A). Such a distribution of the impurity can be formed by controlling the ion implantation conditions. As a model for the calculation, it is considered a structure prepared such that the impurity in the buried layer 502 is distributed from the depth at d=0.2 µm with the surface of the SOI layer as a reference toward the oxide layer 40. Other conditions are identical with those for the case of FIG. 4.

The result of calculation is shown in FIG. 9. In FIG. 9, the thickness of the oxide layer is expressed on the abscissa, the cutoff frequency is expressed on the ordinate, a solid line 90 shows the change of the cutoff frequency in a case of implantation at d=0.2 μm and a dotted line 91 shows the change in the existent structure in FIG. 4(A). While the cutoff frequency fluctuates somewhat depending on the change of the thickness of the oxide layer, it can be seen that the solid line 90 having a deep impurity distribution has a high cutoff frequency. While consideration is made to a case where d=0.2 μm, similar result can also be obtained at d of more than 0.2.

The photo semiconductor integrated circuit device according to the invention based on the foregoing study provides a photo semiconductor integrated circuit device having an SOI substrate, an amplifier portion formed on the SOI substrate, and a photodiode portion formed on the SOI substrate, wherein each of the amplifier portion and the photodiode portion has a buried layer containing an impurity and being connected with an upper electrode, the junction between a first conduction type and a second conduction type in the photodiode portion is in the inside of an epitaxial layer on the SOI substrate, and the impurity concentration of the buried layer of the photodiode portion is lower than the impurity concentration of the buried layer of the amplifier portion. The thickness of the epitaxial layer is preferably 0.8 μm or more. The upper limit for the thickness of the epitaxial layer is practically about 2 μm considering the problem in view of manufacture of a connection layer for connecting the buried layer and the upper electrode (cathode or collector). Further, the impurity concentration of the buried layer in the photodiode portion is preferably within a range from $1\times10^{17}$ cm$^{-3}$ to $1\times10^{18}$ cm$^{-3}$.

By adopting the structure described above, the frequency response of the photodiode prepared on one identical substrate together with other semiconductor integrated circuit device can be improved.

The photo semiconductor integrated circuit device according to this invention also provides a photo semiconductor integrated circuit device having an SOI substrate, an amplifier portion formed on the SOI substrate and a photodiode portion formed on the SOI substrate, wherein the impurity concentration in the SOI substrate of the photodiode portion is lower on the side of the surface of the SOI substrate than the impurity concentration on the side of the insulator of the SOI substrate.

By adopting the constitution as described above, the frequency response of the photodiode prepared on one identical substrate together with other semiconductor integrated circuit device can be improved.

Further, the photo semiconductor integrated circuit device according to this invention also provide a photo semiconductor integrated circuit device comprising an SOI substrate, an amplifier portion formed on the SOI substrate, and a photodiode portion formed on the SOI substrate, wherein each of the amplifier portion and the photodiode portion has a buried layer containing an impurity and being connected with an upper electrode, and the buried layer in the photodiode portion is formed at a position deeper by 0.2 μm or more than the buried layer in the amplifier portion.

By adopting the constitution as described above, the frequency characteristic of the photodiode prepared on one identical substrate together with other semiconductor integrated circuit device can be improved.

Further, the photo semiconductor integrated circuit device according to this invention also provide a photo semiconductor integrated circuit device comprising an SOI substrate, an amplifier portion formed on the SOI substrate, and a photodiode portion formed on the SOI substrate, wherein the thickness of an insulator in the SOI substrate of the photodiode portion is: about $\lambda \div (4\times n)\times m$ where the $\lambda$ represents the wavelength of an incident light, n represents the refractive index of the insulator and m represents a positive odd number. The thickness for the insulator of the SOI substrate of the photodiode portion is preferably about $\lambda \div (4\times n)\times m$ and, practically, it is preferably within a range of: $\{\lambda \div (4\times n)\times m\} \pm \{\lambda \div (8\times n)\}$.

By adopting the constitution as described above, the frequency characteristic of the photodiode prepared on one identical substrate together with other semiconductor integrated circuit device can be improved.

The optical recording reproducing apparatus according to this invention comprises an optical disk for recording information, a semiconductor laser light source, an optical system for focusing an emission light from the semiconductor laser light source to the optical disk, a photodetector for detecting a reflected light from the optical disk and a signal processing section for processing signals detected by the photodetector, wherein the photo semiconductor integrated circuit device is used for the detection of the reflected light and the processing of at least a portion of the detected signals.

The optical recording reproducing apparatus can improve the reproducing speed of the optical recording reproducing device by the improvement of the responsivity and extension of the frequency band width of the photodiode of the photo semiconductor integrated circuit device to be used. Further, in a case of detecting lights of different wavelengths, since it has an effect of improving the responsivity and extending the frequency band width to wavelength for which the responsivity is low and the frequency band width is narrow, one photo semiconductor integrated circuit apparatus can cope with multiple wavelength.

Other and further objects, features and advantages of the invention will appear more fully from the following description.

BRIEF DESCRIPTION OF THE DRAWINGS

A preferred form of the present invention illustrated in the accompanying drawings in which.

DETAILED DESCRIPTION OF THE PREFERRED EMBODIMENTS

This invention is to be described by way of preferred embodiments with reference to the drawings.

Figure 1:
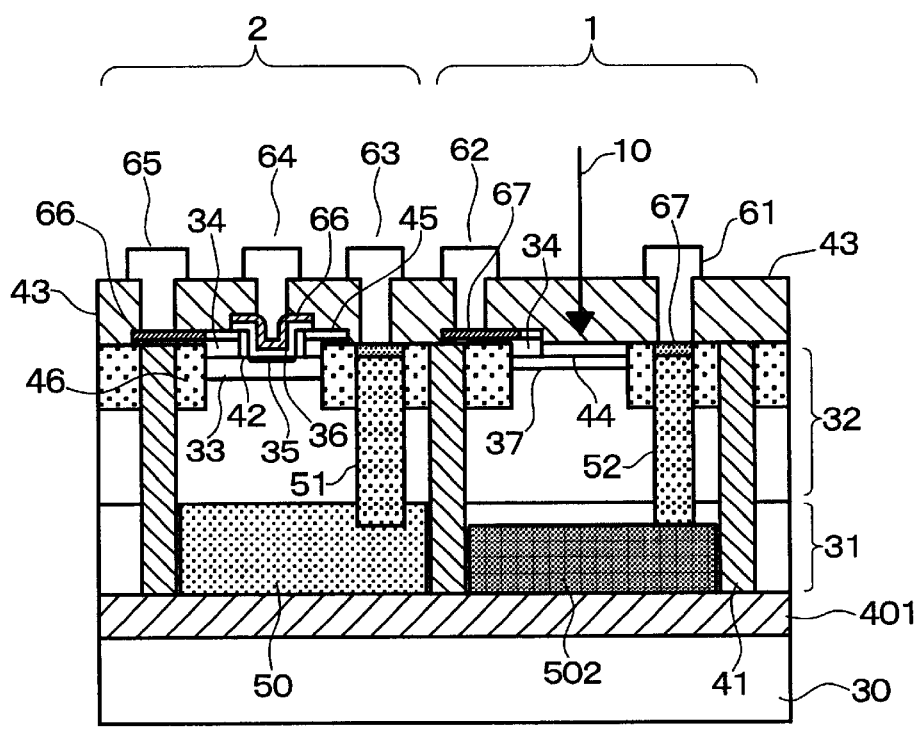
FIG. 1 is a schematic cross sectional view for a first embodiment of a photo semiconductor integrated circuit device according to this invention.

FIG. 1 is a schematic cross sectional view of a first embodiment of a photo semiconductor integrated circuit device according to this invention. A transistor portion 2 as a part of an amplifier portion is identical with that shown in FIG. 2 and the production process is optimized to the transistor portion 2. In a photodiode portion 1, a buried layer 502 is deeply implanted when it is formed to an SOI layer 31. Further, the thickness of an oxide layer 401 is set so as to increase reflection and, for example, a layer thickness of 401 nm is adopted for detecting a light at wavelength of 780 nm.

Figure 10:
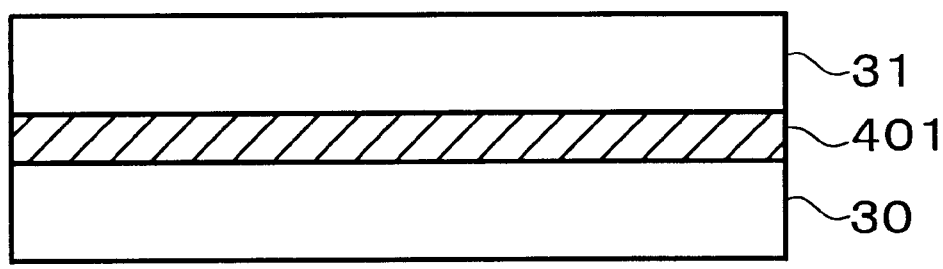
FIG. 10 is a cross sectional view showing a fabrication process of a photo semiconductor integrated circuit device.
Figure 11:
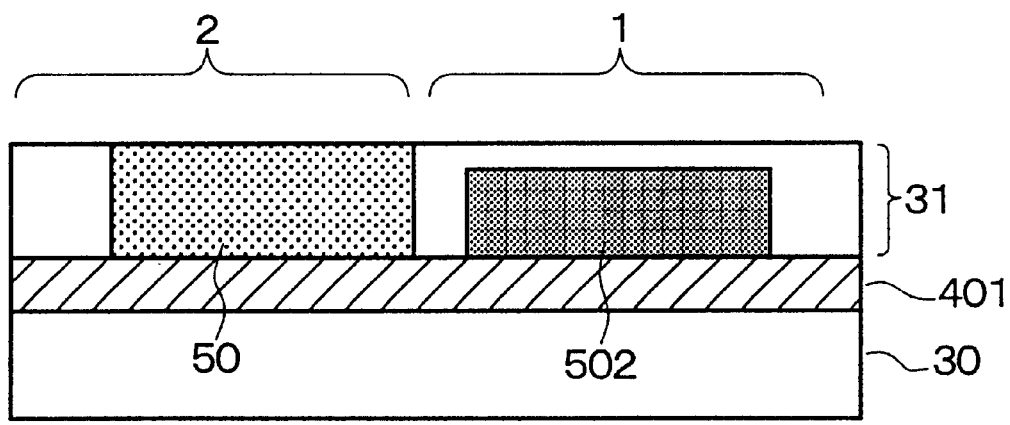
FIG. 11 is a cross sectional view showing a fabrication process of a photo semiconductor integrated circuit device.

The outline for the manufacturing process of a device structure shown in FIG. 1 is to be explained with reference to FIG. 10 to FIG. 12. In an SOI substrate shown in FIG. 10, an oxide layer 401 of 401 nm thickness and an n⁻ type SOI layer 31 (silicon crystal layer) are formed on a handle wafer 30. An impurity such as antimony is injected by ion implantation to the SOI layer 31 (FIG. 11) to form a buried layer. A buried layer 50 is for the transistor portion 2 and the impurity is distributed from the surface. On the other hand, ion implantation is conducted for the photodiode portion 1 by using a mask different from the mask for preparing the buried layer for the transistor and changing implantation conditions. Thus, a buried layer 502 for the photodiode portion 1 is formed in which the impurity is distributed at a position apart by 0.2 μm from the sides.

Figure 12:
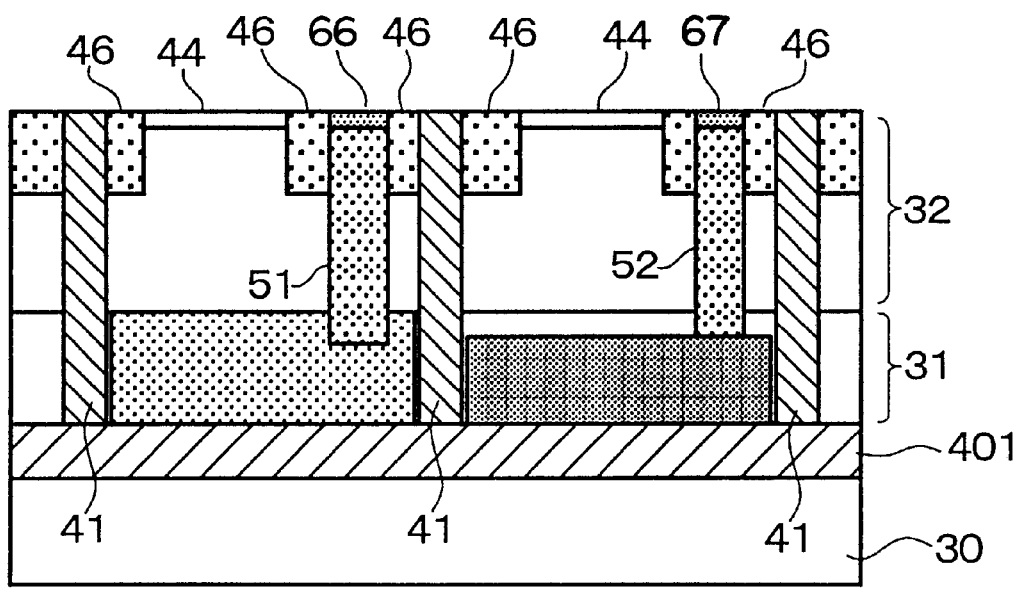
FIG. 12 is a cross sectional view showing a fabrication process of a photo semiconductor integrated circuit device.

Further, as shown in FIG. 12, an epitaxial layer 32 (first semiconductor layer) is grown to 1.2 μm thickness. Then, shallow grooves 46 for intra-device isolation are formed, and an oxide layer is buried. The deep grooves 41 for inter device isolation are formed and an oxide layer is buried. Then, the surface of the epitaxial layer 32 is oxidized to form an oxide layer 44 and then an n-type diffusion layer 51 for collector junction and an n-type diffusion layer 52 for cathode junction are formed by ion implantation of phosphorus.

Then, as shown in FIG. 1, a p⁺ layer 37 (second semi-conductor layer) for the photodiode portion and a base diffusion layer 33 are formed and polysilicon 34 for leading base and cathode, an oxide layer 45 and a side wall oxide layer 42 are formed. Then, after forming polysilicon 36 and an emitter diffusion layer 35 for the emitter, an oxide layer for passivation is deposited. A window is opened in the oxide layer, Ti is deposited and silicide layers 66, 67 for decreasing the contact resistance are formed by heat treatment. After depositing a passivation layer 43 again and flattened the same, contact windows are opened and a collector 63, an emitter 64, a base 65, a cathode 61 and an anode 62 are formed to complete a device.

Figure 2:
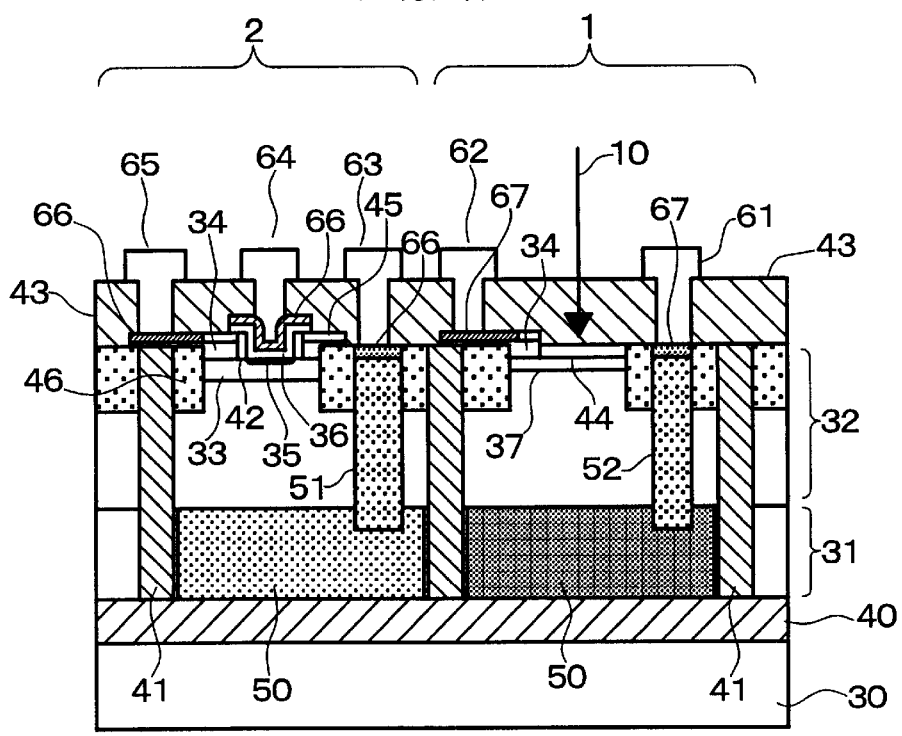
FIG. 2 is a schematic cross sectional view of an existent photo semiconductor integrated circuit device.
Figure 3:
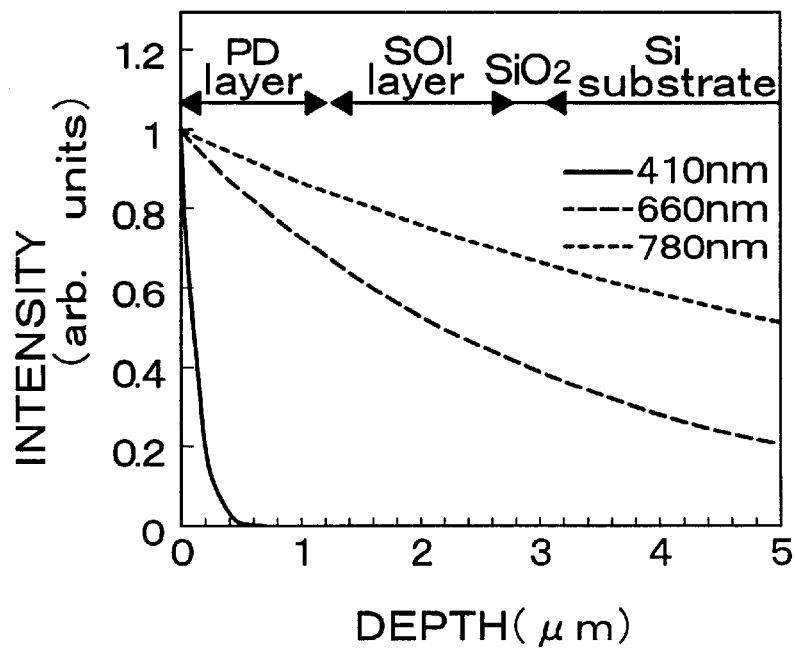
FIG. 3 is a view illustrating the state of light intruding into silicon crystals.
Figure 4A:
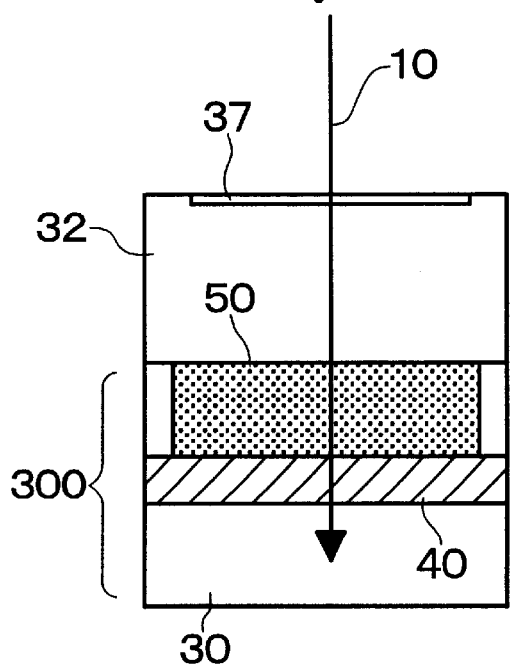
FIG. 4 is a cross sectional view for comparison showing the reduction of impurity concentration in a buried layer of a photodiode.
Figure 4B:
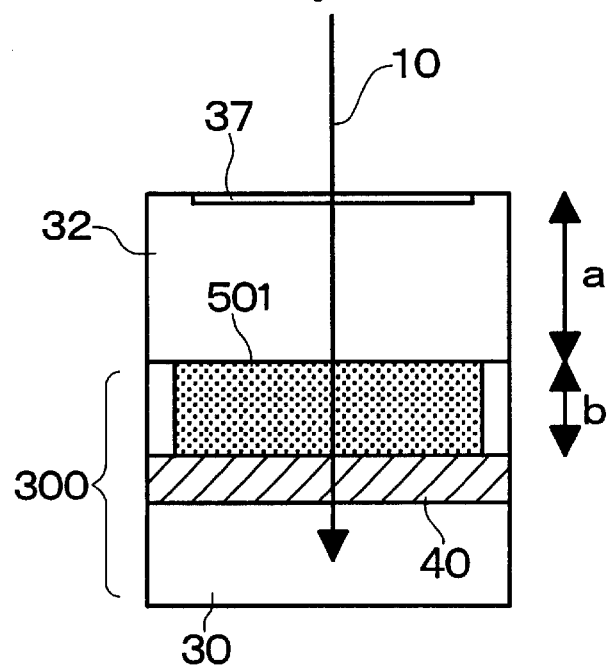
Figure 5:
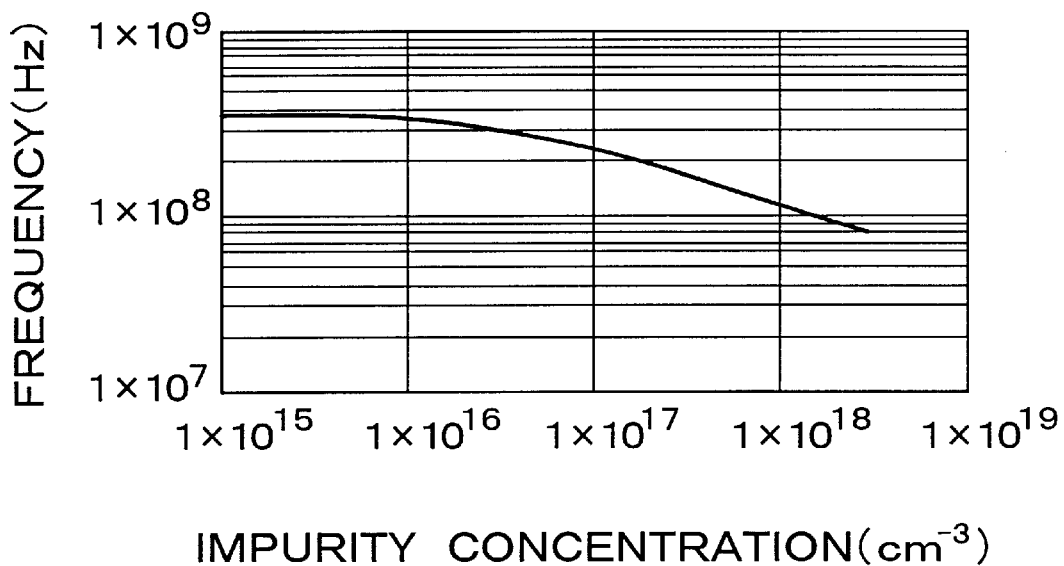
FIG. 5 is a graph showing the dependence of a cutoff frequency of a photodiode on the impurity concentration.
Figure 6:
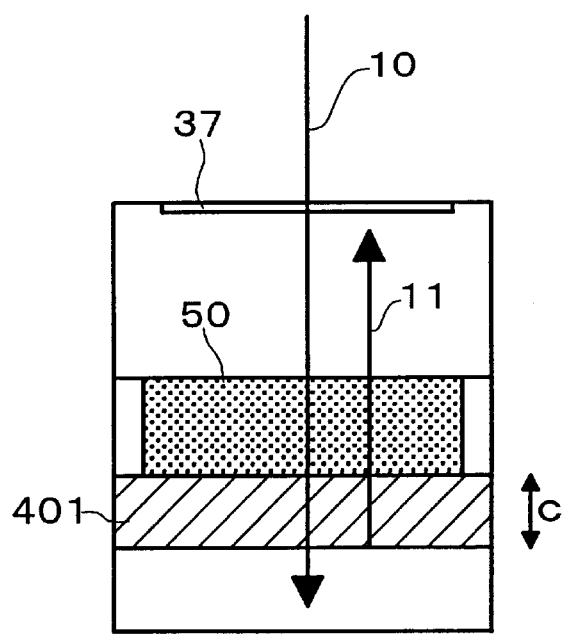
FIG. 6 is a schematic cross sectional view illustrating the change of the thickness for an oxide layer of an SOI substrate.
Figure 7:
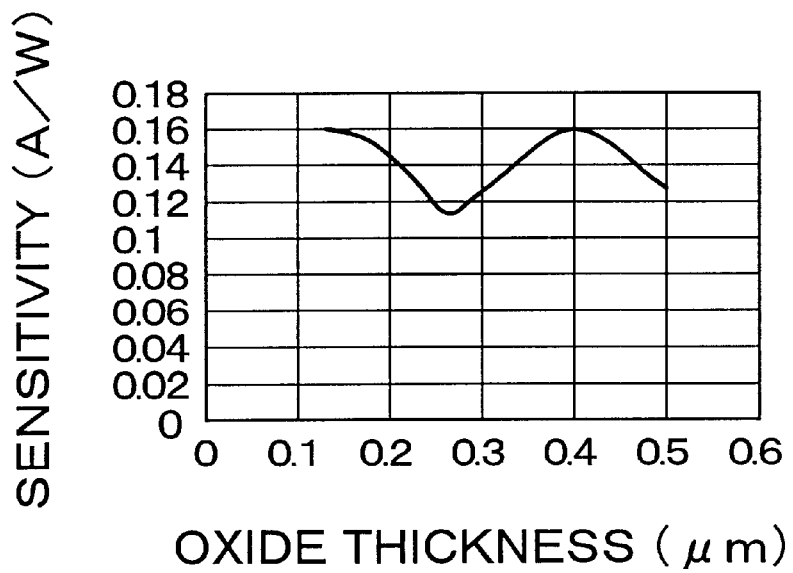
FIG. 7 is a graph showing the dependence of the photodiode responsivity on the thickness of an oxide layer.
Figure 8:
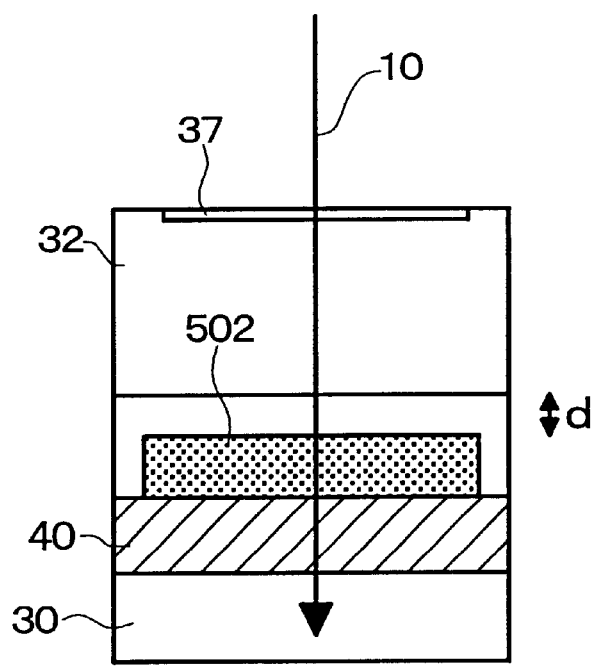
FIG. 8 is a schematic cross sectional view showing that a buried layer of a photodiode is distributed deeply.
Figure 9:
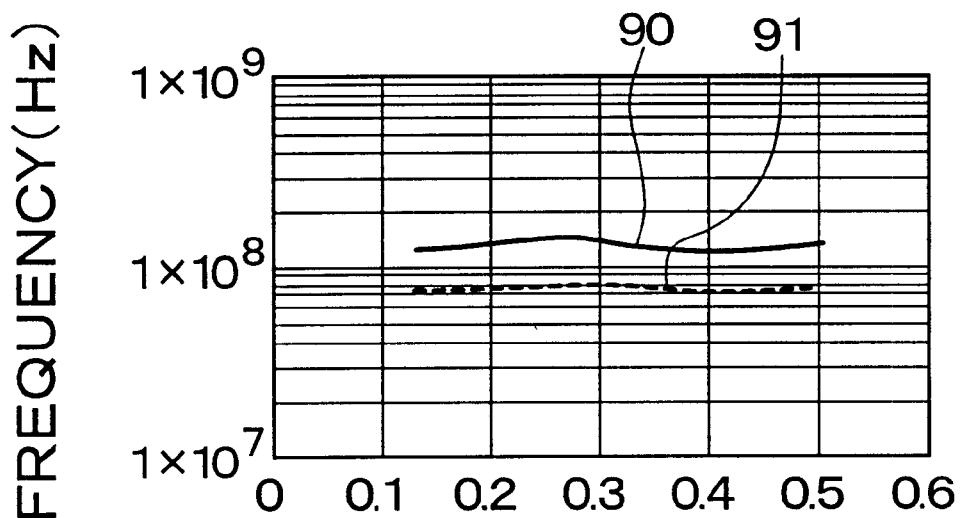
FIG. 9 is a graph for comparing the dependence of a cutoff frequency of a photodiode on an oxide layer compared with that of an existent structure.

In the photo semiconductor integrated circuit device of this embodiment, the responsivity is improved and the frequency band width is extended in the photodiode by the effect explained with reference to FIGS. 6 and 7 and FIGS. 8 and 9, compared with the photo semiconductor integrated circuit device of the existent structure shown in FIG. 2.

Figure 13:
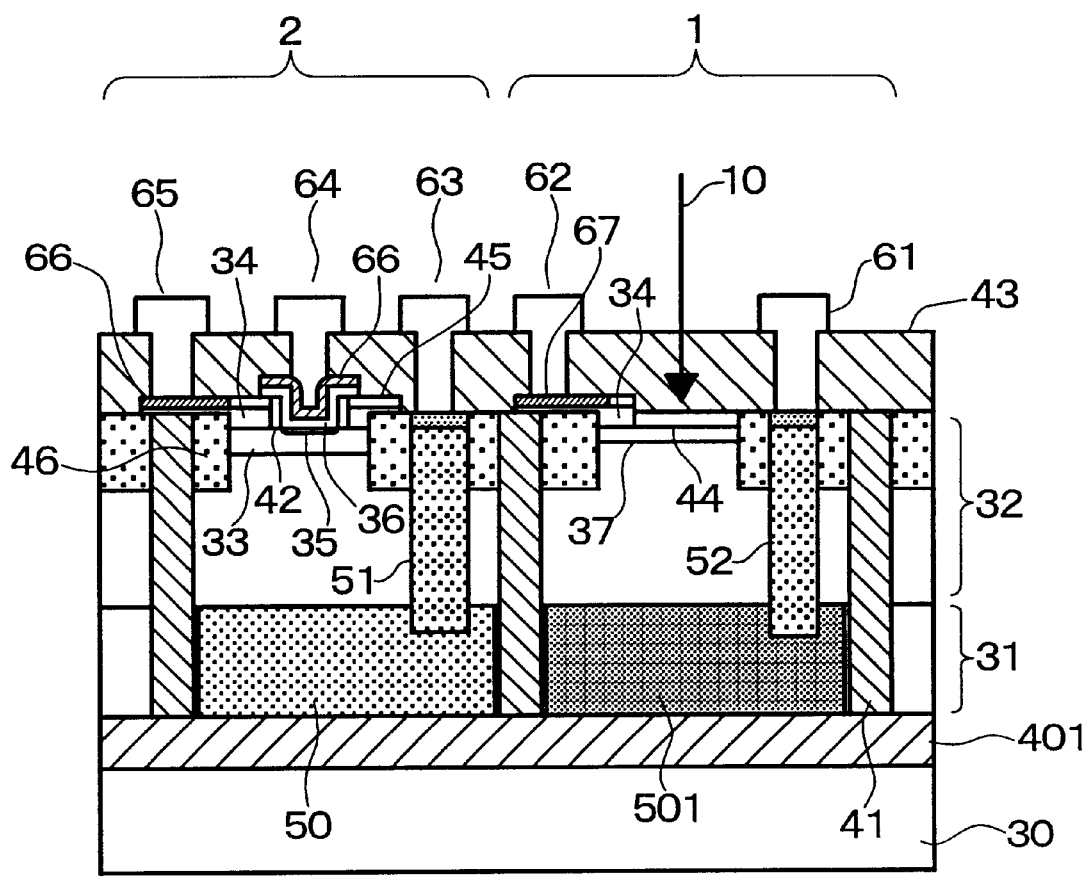
FIG. 13 is a schematic cross sectional view showing a second embodiment of a photo semiconductor integrated circuit device according to this invention.
Figure 14:
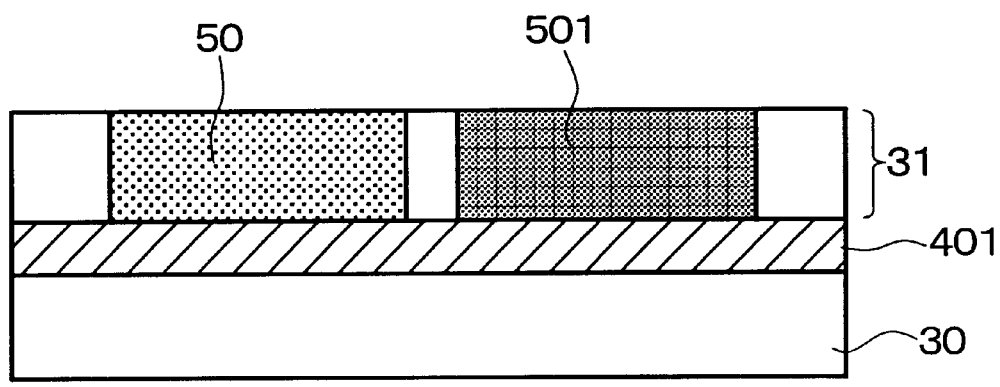
FIG. 14 is a schematic cross sectional structural view showing a portion of a fabrication process for the second embodiment.

FIG. 13 is a schematic cross sectional view showing a second embodiment of a photo semiconductor integrated circuit device according to this invention. In this embodiment, the impurity concentration of a buried layer 501 is lowered to less than that of the buried layer 50 in the transistor portion. In this case, as shown in FIG. 14, a buried layer 501 is prepared by using a mask for a photodiode which is different from the photomask for preparing the buried layer 50 for the transistor portion in the production process and the amount of impurity implantation is decreased. The impurity concentration of the buried layer 50 in the transistor portion is $1 \times 10^{18}$ cm$^{-3}$ and the impurity concentration of the buried layer 501 in the photodiode portion was $1 \times 10^{17}$ cm$^{-3}$. A photo semiconductor integrated circuit device was fabricated by replacing the fabrication process for the buried layers 50, 501 with the manufacturing process shown in FIG. 11 described above, with other processes being identical with those in the embodiment described above.

In the photo semiconductor integrated circuit device of this embodiment, the frequency band width is extended by about twice compared with that of the photo semiconductor integrated circuit device of the existent structure shown in FIG. 2 by the effect explained with reference to FIGS. 4 and 5 and FIGS. 6 and 7.

Figure 15:
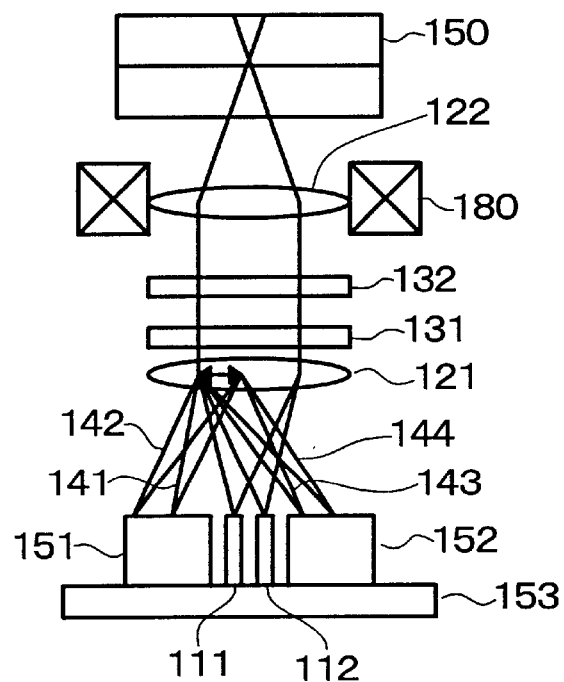
FIG. 15 is a schematic view showing an embodiment of an optical recording reproducing apparatus.

FIG. 15 is a schematic view showing an embodiment of an optical recording reproducing apparatus using the photo semiconductor integrated circuit device according to this invention. In this embodiment, two semiconductor laser light sources 111, 112 are used. The semiconductor laser light source 111 emits a short wave length light at an emission wave length of 410 nm, and a semiconductor laser light source 112 emits a long wave length light at an emission wave length of 660 nm In this embodiment, the laser light sources used are switched depending on the type of the optical disk. The laser emission position of both of the sources situate near the optical axis and the emission light is formed into a parallel light through a collimator 121. The parallel light, after passing through a polarized diffraction grating 131, is converted into a circularly polarized light by a λ/4 wavelength plate 132 and condensed through an objective 122 to an optical disk 150. The reflected light from an information mark recorded on the optical disk, after transmitting the objective 122, is converted again through the λ/4 wavelength plate 132 into a linearly polarized light and diffracted by the polarized diffraction grating 131.

Figure 16:
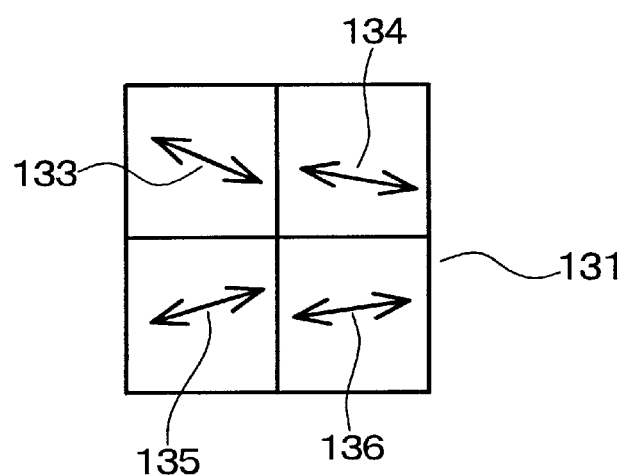
FIG. 16 is a view showing diffraction directions of light divided by four in a polarized diffraction grating.

The polarized diffraction grating is sected into four and, because of the difference in the shape of the grating, they diffract light into the directions 133, 134, 135 and 136 respectively as shown in FIG. 16. The expression for the diffracted light in FIG. 15 is shown only for the diffracted light from one diffraction pattern and diffracted lights from other three patterns are omitted. The diffracted light transmits the collimator 121 about within a range about shown by arrows, and (−) primary diffracted light 141 and (+) primary diffracted light 143 of a short wavelength light, and (−) primary diffracted light 142 and (+) primary diffracted light 144 of a long wavelength light are focused at different positions on the photo semiconductor integrated circuit devices 151 and 152. Photo semiconductor integrated circuit devices 151 and 152 are on a silicon substrate 153 and the photo semiconductor integrated circuit device are appended on the silicon substrate in this embodiment but they may be prepared directly to the silicon substrate. In the same manner, semiconductor lasers 111 and 112 are also appended on the silicon substrate 153 and adjusted such that the emission direction is directed upward by using a micro prism or the like. The photo semiconductor integrated circuit device used in this embodiment is the photo semiconductor integrated circuit device shown in the first embodiment or the second embodiment described above.

Figure 17:
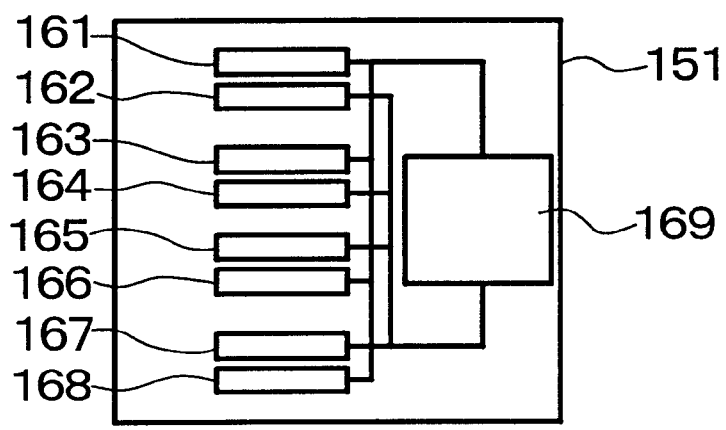
FIG. 17 is a schematic view of a photo semiconductor integrated circuit device for detecting focus error signal.

FIG. 17 shows the outline of the photo semiconductor integrated circuit device 151 for detecting (−) primary diffracted light. The photo semiconductor integrated circuit device 151 is used for generation of focus error signals and controls the position of the objective 122 by servo-control of a focus position adjusting device 180 in FIG. 15. Photodiodes 161-168 are arranged in the photo semiconductor integrated circuit device 151 in which both 161 and 162 detect the light from the polarized diffraction grating for the direction 133, and the photodiodes 163 and 164 detect the diffracted light by the polarized diffraction grating for the direction 134. In the same manner, photodiodes 165 and 166 detect the light from the polarized diffraction grating for the direction 136, while photodiodes 167 and 168 detect the light from the polarized diffraction grating for the direction 135. The size for each of the photodiodes is about 40 $\mu$m×600 $\mu$m. While the diffraction direction is different depending on the difference of the wavelength, both of long and short wavelength lights can be detected by adjusting the length of the photodiodes. The responsivity of both of them is adapted to be decreased in a gap between respective pairs of the photodiodes as the distance increases. When the optical disk 150 is at a focused position, the diffracted light is condensed at the central position between both of them and the amounts of lights incident to the paired photodiodes are made equal. On the other hand, when the optical disk 150 is out of the focal position, the amounts of lights incident to both of them are not equal. In this embodiment, the photodiodes 161, 163, 166 and 168 are wired to form a first addition signal and, on the other hand, the photodiodes 162, 164, 165 and 167 are wired to form a second addition signal. A difference signal between both of them forms a focal position control signal. An amplifier circuit 169 amplifies and takes the difference for the photocurrent and the circuit is prepared on one identical substrate.

Figure 18:
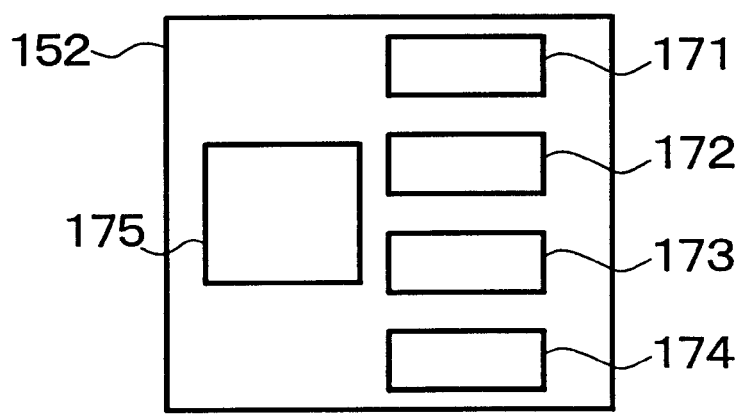
FIG. 18 is a schematic view of a photo semiconductor integrated device for detecting tracking error signals.

The photo semiconductor integrated circuit device 152 is used for generating tracking error signals by using (+) primary light. The responsive region of the photodiodes in FIG. 18 is shown by 171, 172, 173 and 174. The size for the each of the photodiodes is about 80 $\mu$m×600 $\mu$m. The photodiode 171 detects the diffracted light in the direction 135, the photodiode 172 detects the diffracted light in the direction 136, the photodiode 173 detects the diffracted light in the direction 134 and the photodiode 174 detects the diffracted light in the direction 133 (FIG. 16), respectively. The size for each of the photodiodes is designed such that lights of two wavelengths are entered. The photo-current from the photodiodes is put to signal processing by an amplifier circuit 175 comprising, for example, transistors prepared simultaneously by the same process on one identical substrate.

Generation of a tracking error signals is conducted by a phase difference detection method and lights orthogonal to each other transmitting through four regions in FIG. 16 are added respectively and a difference signal therebetween is taken. That is, the signal from the photodiode 171 and the signal from the photodiode 173, and the signal from the photodiode 172 and the signal from the photodiode 174 are added respectively, the difference between the result of the two addition is taken to form a tracking error. The tracking error signal controls in the direction perpendicular to the optical axis of the objective 122 by a focal position adjusting device 180 in FIG. 15 through a servo control circuit. Further, the sum for all of the signals forms a reading signal form the optical disk.

In the foregoing embodiments described above, explanation has been made as that the first semiconductor layer 1 is n type and the second semiconductor layer is n type, but this invention is not restricted only thereto.

As has been described above, according to this invention, the performance of the photodiodes can be improved without degrading the performance of other semiconductor integrated circuit device on the photo semiconductor integrated circuit device.

The foregoing invention has been described in terms of preferred embodiments. However, those skilled, in the art will recognize that many variations of such embodiments exist. Such variations are intended to be within the scope of the present invention and the appended claims.

What is claimed is:

1. A photo semiconductor integrated circuit device comprising a silicon on insulator (SOI) substrate, an amplifier portion formed on the SOI substrate having a first side facing an irradiating light and a second side facing an insulator, and a photodiode portion formed on the SOI substrate wherein, the impurity concentration of the SOI substrate on the first side is less than that of the SOI substrate on the second side in a region of the SOI substrate on which the photodiode portion is formed.

* * * * *